United States Patent [19]

Iacovangelo et al.

[11] Patent Number: 5,336,368

[45] Date of Patent: Aug. 9, 1994

[54] METHOD FOR DEPOSITING CONDUCTIVE METAL TRACES ON DIAMOND

[75] Inventors: Charles D. Iacovangelo, Schenectady; Elihu C. Jerabek, Glenmont, both of N.Y.; Bradley E. Williams, Worthington, Ohio

[73] Assignee: General Electric Company, Schenectady, N.Y.

[21] Appl. No.: 87,300

[22] Filed: Jul. 8, 1993

[51] Int. Cl.$^5$ .......................... B44C 1/22; C23F 1/00
[52] U.S. Cl. ................................ 156/656; 156/650; 156/901; 156/651
[58] Field of Search ............... 156/DIG. 68, 634, 650, 156/656, 659.1, 662, 901, 651; 423/446; 427/250; 437/100

[56] References Cited

U.S. PATENT DOCUMENTS

| | | | |
|---|---|---|---|
| 5,034,784 | 7/1991 | Yamazaki | 437/100 X |
| 5,107,315 | 4/1992 | Kumagai et al. | 437/100 X |
| 5,250,149 | 10/1993 | Kimoto et al. | 156/612 |

Primary Examiner—William Powell
Attorney, Agent, or Firm—William H. Pittman

[57] ABSTRACT

Adherent traces of a carbide-forming conductive metal are produced on a diamond surface, without deposition of carbide in areas to be non-conductive, by depositing an undercoat layer of a non-carbide-forming metal such as palladium, patterning said undercoat layer and then depositing a bond layer of the carbide-forming metal. The undercoat layer and the portion of the bond layer deposited thereon are then removed, typically by etching.

15 Claims, No Drawings

METHOD FOR DEPOSITING CONDUCTIVE METAL TRACES ON DIAMOND

This invention relates to the processing of diamond for electronic applications, and more particularly, to providing metal traces on diamond surfaces.

Diamond is of high interest as a substrate material for use in integrated circuits and multi-chip modules. This is particularly true of synthetic diamond prepared by chemical vapor deposition (hereinafter "CVD diamond"); i.e., by thermal activation of a mixture of hydrogen and a hydrocarbon at low pressure, whereupon diamond is deposited on a substrate surface. By reason of its low electrical and high thermal conductivity and consequent efficiency as a heat sink material, it is of particular interest for use in high density interconnect modules and circuits containing laser diodes, where the circuit elements are packed closely together and heat dissipation is essential.

The manufacture of such modules generally requires the deposition of connecting conductive metal traces on the diamond surface. It is conventional to employ carbide-forming metals for such traces, since carbide formation by reaction of the metal at the surface of the diamond provides strong adhesion of the metal trace to said surface. Ordinarily, the entire diamond surface is metallized and the resulting metal layer is photolithographically patterned and etched to remove the metal in the areas where traces are not desired.

A major problem with this technique is that while the metal may be removed by etching, the carbide generally is not. It is also highly conductive and would cause short circuits if it remained on the diamond surface. Therefore, additional steps to remove carbide are necessary. Such steps introduce a high degree of complexity, since the only etching solutions which are effective to remove carbide also attack photoresists.

One technique which has been employed with some success is reactive ion etching. However, it is capital intensive and presents a risk of attack to the metal traces. Another technique is oxidation of the diamond underneath the carbide, followed by lifting the carbide away. However, its success depends to a high extent on the thickness and porosity of the carbide layer and submits the metallization to repeated thermal excursions, resulting in possible damage. Still another technique is laser ablation, but it forms grooves in the diamond and is not adaptable to fine detail work of the sort required for integrated circuits and multi-chip modules.

Accordingly, the development of a method to prevent contact of carbide-forming metal with diamond where metallization is not desired, thus inhibiting the formation of carbide in those areas, is of high interest. Such a method is provided by the present invention.

The invention is a method for depositing conductive metal traces on a diamond surface which comprises:
  depositing an undercoat layer of a non-carbide-forming metal on at least a portion of said diamond surface,
  patterning said undercoat layer with a first pattern to expose said diamond surface in the trace-receiving areas thereof,
  depositing a bond layer of conductive carbide-forming metal on said undercoat layer and the exposed diamond surface, and
  removing said undercoat layer and the portion of said top layer deposited thereon.

Any diamond surface, single crystal or polycrystalline, may be treated by the method of this invention. However, it is most useful with polycrystalline diamond, and especially with CVD diamond. The CVD diamond may remain on the substrate on which it is deposited, but is more often removed therefrom as a sheet, which may be cut into units of the desired size and shape for use in integrated circuits.

Typically, the electrical surface resistance of uncontaminated diamond is greater than 15 M$\Omega$/mm and its resistivity is on the order of $10^{13}$ $\Omega$-cm. However, surface resistance may decrease substantially if the diamond is contaminated with such materials as metal. Moreover, adhesion of metal traces thereto may be poor if there is carbon in graphitic form on the surface of the diamond. Therefore, it is advisable to thoroughly remove metal, graphite and other contaminants prior to performing the method of the invention. This may be achieved by contacting the diamond at relatively high temperature with various strong acid mixtures. Contact with a boiling hydrochloric-hydrofluoric-nitric acid mixture to remove traces of metal, and with a boiling sulfuric-nitric acid mixture to remove graphite, is conventional. Following cleaning, the diamond surface is preferably treated to promote adhesion of the carbide-forming metal layer, as by sputter etching.

In the first step of the method of this invention, an undercoat layer of a non-carbide-forming metal is deposited on at least a portion and preferably all of the diamond surface. The purpose of this metal is to serve as a barrier which prevents contact between the diamond and a subsequently deposited carbide-forming metal, thus preventing carbide formation in areas where non-conductivity is desired.

Suitable non-carbide-forming metals include aluminum, copper, nickel, silver, gold, palladium and platinum, as well as alloys and mixtures thereof. Gold has the advantage of being easily removed when appropriate, by etching with a relatively mild iodine-alkali metal iodide solution. However, it has two disadvantages. It is subject to intermetallic diffusion by carbide-forming metals such as titanium, which may thus contact the diamond surface and form carbide in some proportion even in the presence of the gold undercoat layer; and it has a tendency to peel from the diamond surface.

Therefore, the undercoat metal is preferably one that adheres well and provides a barrier to intermetallic diffusion. The preferred metal for this purpose is palladium.

The undercoat layer may be deposited by conventional techniques such as physical or chemical vapor deposition, electroless or electrolytic deposition or sputtering. Sputtering is often preferred. The thickness of said layer is typically about 100–5000 and preferably about 1000–5000 Å.

The undercoat layer is then patterned to expose the surface of the diamond in the areas to receive conductive traces. Conventional photolithographic patterning is typically employed for this purpose.

Following the patterning step, a bond layer of conductive carbide-forming metal is deposited, also by conventional methods such as those previously listed. Illustrative metals which may be deposited at this stage are titanium, tungsten, molybdenum, chromium, niobium and tantalum, as well as alloys and mixtures thereof. The thickness of the top layer is typically about 500–2000 Å.

It is usually preferred to deposit at least one further metal layer over the bond layer. For example, gold is frequently deposited over titanium, most often with an intervening barrier layer of nickel, palladium or platinum, to facilitate wire bonding, soldering and die-attach.

Finally, the undercoat layer is removed along with the portion of the top layer deposited thereover. Removal is ordinarily effected by etching with conventional etching solutions. For example, gold and palladium may be etched by the aforementioned iodine-alkali metal iodide solutions, and titanium by the action of hydrofluoric acid. Suitable etching solutions for removing these and other metals will be apparent to those skilled in the art. For the sake of precision, it may be desirable to pattern the top layer for removal, using a negative of the undercoat layer pattern.

By reason of the presence of the undercoat layer according to the present invention, there is little or no contact of the diamond with the carbide-forming metal. Therefore, little or no carbide is formed and there is no necessity for its removal. The diamond surface is consequently provided with the required conductive traces and there is essentially no conductivity in the areas between said traces.

The method of this invention is illustrated by the following examples. The CVD diamond samples used in the examples were about 12 mm. square and 250 microns thick. They were first cleaned for 12 hours in a boiling mixture of equal volumes of hydrochloric, hydrofluoric and nitric acids to remove metal contaminants, and then for 4 hours in a boiling mixture of 4 volumes of sulfuric acid and 1 volume of nitric acid to remove graphitic carbon, from the surface. The surface resistance of each sample was determined after cleaning to be greater than 15 MΩ/mm, the upper limit of the resistance meter employed. The surfaces of the samples were then sputter etched for 6 minutes.

EXAMPLE 1

A diamond sample was coated with 3500 Å of palladium by sputtering. A photolithographic mask was applied and the palladium in the unmasked regions was removed by etching for about 5 minutes in a solution of 0.1M iodine and 0.6M potassium iodide at 50°–70° C.

The diamond containing the patterned palladium layer was coated with 1000 Å of titanium and 2000 Å of gold, both by sputtering. To determine surface resistance, the gold was then removed by etching for about 5 minutes in the same solution and the titanium by etching with 3% (by weight) aqueous hydrofluoric acid solution at 25° C. After drying, the surface resistance of the diamond in the previously gold-coated titanium regions was in the range of 8–18 KΩ/mm; in the formerly palladium-coated areas it was greater than 15 MΩ/mm. Thus, the palladium undercoat layer was effective to prevent titanium carbide formation on the diamond surface.

In a control experiment, a diamond piece was coated with titanium and gold but not with palladium. After patterning and etching, the surface resistance in the uncoated areas was only about 3-KΩ/mm, inadequate for electronic use. Even after two additional hydrofluoric acid etching operations, no increase in resistance was observed.

EXAMPLE 2

The procedure of Example 1 was repeated, except that the thickness of the titanium layer was 2000 Å. The purpose of this example was to assess the effect on the palladium layer of the increased article temperature during the titanium sputtering operation. The surface resistance in the palladium-coated areas remained above 15 MΩ/mm, demonstrating that there was no measurable intermetallic diffusion of titanium through the palladium undercoat to the diamond layer.

EXAMPLE 3

The procedure of Example 1 was repeated, except that the palladium undercoat was replaced with a 4000-Å gold undercoat. The surface resistance in the formerly gold/titanium-coated regions was in the range of 10–30 KΩ/mm, and that in the other areas was about 7000 KΩ/mm.

Upon closer examination, it was found that traces of gold remained on the diamond surface. The gold and titanium etching operations were repeated twice, after which the resistance in the other areas was above 15 MΩ/mm.

In two repeats of this procedure, it was found that the gold layer peeled off the diamond surface during patterning. Thus, palladium is preferred as an undercoat material.

What is claimed is:

1. A method for depositing conductive metal traces on a diamond surface which comprises:

depositing an undercoat layer of a non-carbide-forming metal on at least a portion of said diamond surface, patterning said undercoat layer with a first pattern to expose said diamond surface in the trace-receiving areas thereof, depositing a bond layer of conductive carbide-forming metal on said undercoat layer and the exposed diamond surface, and removing said undercoat layer and the portion of said top layer deposited thereon.

2. A method according to claim 1 wherein the diamond is polycrystalline diamond prepared by chemical vapor deposition.

3. A method according to claim 2 wherein contaminants are initially removed from the diamond surface.

4. A method according to claim 1 wherein the non-carbide-forming metal is aluminum, copper, nickel, silver, gold or palladium or alloys or mixtures thereof.

5. A method according to claim 4 wherein the non-carbide-forming metal is palladium.

6. A method according to claim 4 wherein the thickness of the undercoat layer is about 1000–5000 Å.

7. A method according to claim 4 wherein the undercoat layer is deposited by sputtering.

8. A method according to claim 1 wherein the carbide-forming metal is titanium, tungsten, molybdenum, chromium, niobium or tantalum or alloys or mixtures thereof.

9. A method according to claim 8 wherein the carbide-forming metal is titanium.

10. A method according to claim 8 wherein the thickness of the bond layer is about 500–2000 Å.

11. A method according to claim 8 wherein the bond layer is deposited by sputtering.

12. A method according to claim 8 wherein at least one further metal layer is deposited over the bond layer.

13. A method according to claim 12 wherein the carbide-forming metal is titanium and the further metal layer is gold.

14. A method according to claim 1 wherein removal of the metal layers is by etching.

15. A method according to claim 14 wherein the bond layer is patterned for etching, using a negative of the undercoat layer pattern.

* * * * *